(12) United States Patent
Gauthier

(10) Patent No.: US 8,941,006 B2
(45) Date of Patent: Jan. 27, 2015

(54) APPARATUS AND METHOD FOR EXTENDING POLYOLEFIN CONTAINING PHOTOVOLTAIC PANEL LIFE SPAN

(75) Inventor: William Gauthier, Houston, TX (US)

(73) Assignee: Fina Technology, Inc., Houston, TX (US)

( * ) Notice: Subject to any disclaimer, the term of this patent is extended or adjusted under 35 U.S.C. 154(b) by 410 days.

(21) Appl. No.: 13/034,721

(22) Filed: Feb. 25, 2011

(65) Prior Publication Data

US 2012/0216864 A1     Aug. 30, 2012

(51) Int. Cl.
*H01L 51/46* (2006.01)
*H01L 51/44* (2006.01)
*H01L 51/00* (2006.01)
*H01L 51/52* (2006.01)

(52) U.S. Cl.
CPC ........... *H01L 51/448* (2013.01); *H01L 51/0097* (2013.01); *H01L 51/5259* (2013.01); *Y02E 10/549* (2013.01)
USPC .......................................... 136/263; 136/252

(58) Field of Classification Search
CPC .. H01L 51/097; H01L 51/448; H01L 51/5259
USPC ................................................ 136/263, 252
See application file for complete search history.

(56) References Cited

U.S. PATENT DOCUMENTS

| | | | |
|---|---|---|---|
| 4,164,431 A | 8/1979 | Tang | |
| 4,761,061 A * | 8/1988 | Nishiyama et al. | 359/265 |
| 6,093,757 A | 7/2000 | Pern | |
| 7,597,927 B2 | 10/2009 | Peumans et al. | |
| 7,772,484 B2 | 8/2010 | Li et al. | |
| 7,777,128 B2 | 8/2010 | Montello et al. | |
| 7,781,672 B2 | 8/2010 | Gaudiana et al. | |
| 2001/0009160 A1* | 7/2001 | Otani et al. | 136/251 |
| 2002/0081358 A1 | 6/2002 | Galland et al. | |
| 2006/0102891 A1 | 5/2006 | Brabec et al. | |
| 2007/0092832 A1 | 4/2007 | Grossman et al. | |
| 2008/0083455 A1 | 4/2008 | Li et al. | |
| 2008/0115833 A1 | 5/2008 | Carlson | |
| 2010/0147386 A1 | 6/2010 | Benson-smith et al. | |
| 2011/0036391 A1 | 2/2011 | McCormick et al. | |
| 2011/0132449 A1 | 6/2011 | Ramadas et al. | |

FOREIGN PATENT DOCUMENTS

WO   WO 2009/126115 A1 * 10/2009   ............ H05B 33/04
WO   2010132951 A1   11/2010

OTHER PUBLICATIONS

Jens A. Hauch, Pavel Schilinsky, Stelios A. Choulis, Sambatra Rajoelson, Christoph J. Brabec., The Impact of Water Vapor Transmission Rate on the Lifetime of Flexible Polymer Solar Cells, Applied Physics Letters 93, 103306, published online Sep. 9, 2008.

* cited by examiner

*Primary Examiner* — Golam Mowla

(57) ABSTRACT

A photovoltaic cell containing at least one substrate, two electrode layers, an organic photovoltaic layer situated between the two electrode layers, and an oxygen scavenger composition.

18 Claims, 3 Drawing Sheets

APPARATUS AND METHOD FOR EXTENDING POLYOLEFIN CONTAINING PHOTOVOLTAIC PANEL LIFE SPAN

CROSS-REFERENCE TO RELATED APPLICATIONS

Not applicable.

FIELD

The present invention is generally related to polyolefin containing panels, such as solar panels, liquid crystal display (LCD) panels, or light-emitting diode (LED) panels. In an embodiment the present invention is related to extending the life span of organic solar panel technologies.

BACKGROUND

Global interest in renewable energy sources has seen an increase in recent times. Due to environmental factors, geopolitical concerns and energy costs, options are being explored to replace our dependence on fossil fuels. Some of the various renewable energy sources include photovoltaic cells, or solar cells. Photovoltaic cells are an attractive option partially because of their potential to capture the large amounts of energy emitted from the sun and convert it to electricity.

Organic photovoltaic (OPV) cells may be used in place of common silicon and other inorganic photovoltaic cells. Silicon cells are relatively expensive and are generally limited to rigid, high cost designs. Organic photovoltaic cells (OPVC) are photovoltaic cells that use organic electronics. Organic electronics deals with conductive organic polymers or small organic molecules that are capable of light absorption and charge transport. One of the general features of organic photovoltaic cells is their lower cost due to the ability to coat them economically on flexible substrates. The resulting flexible cells are easier and less expensive to integrate in buildings, vehicles, and other substrates where capture, storage and usage are desirable.

It would be desirable protect the organic photovoltaic cell from the harmful effects of oxygen. It would also be desirable to increase the shelf life, as well as the overall lifetime, of organic photovoltaic cells.

SUMMARY

An embodiment of the present invention is a photovoltaic cell having at least one substrate, two electrode layers, an organic photovoltaic layer situated between the two electrode layers and an oxygen scavenger composition.

The substrate can be selected from the group consisting of polyethylene, polyethylene terephthalate, polyethylene naphthalate, a polyimide, and combinations thereof. The organic photovoltaic layer can contain an electron acceptor material and an electron donor material. The electron acceptor material can be selected from fullerenes, oxadiazoles, carbon nanorods, discotic liquid crystals, inorganic nanoparticles, inorganic nanorods, and polymers containing moieties capable of accepting electrons or forming stable anions, and combinations thereof. The electron donor material can be selected from the group consisting of discotic liquid crystals, polythiophenes, polyphenylenes, polyphenylvinylenes, polysilanes, polythienylvinylenes, and polyisothianaphthalenes, and combinations thereof. The substrate can include a polyolefins-based overwrap that includes an oxygen scavenger layer. The polyolefins-based overwrap can include an oxygen scavenger layer situated between two barrier layers, where the two barrier layers are situated between two adhesive layers and the two adhesive layers are situated between two polyolefin layers. The barrier layers can be selected from polyacrylonitrile (PAN), poly(vinylidene dichloride) (PVDC), polyethylene terephthalate (PET), ethylene vinyl alcohol (EVOH), nylon, polyethylene naphthalate (PEN), and combinations thereof. The adhesive layers can include ethylene-vinyl acetate (EVA), low density polyethylene (LDPE), ethylene-methacrylate copolymers, ethylene-butylacrylate copolymers, and combinations thereof.

The oxygen scavenger composition can be incorporated into the substrate. The oxygen scavenger layer can be selected from the group of ethylenically unsaturated polymers, ethylene methylacrylate cyclohexenylmethyl acrylate terpolymer, ethylene vinyl cyclohexene copolymer, ethylene cyclohexenylmethyl acrylate copolymer, cyclohexenylmethyl acrylate homopolymer, ethylene vinyl toluene copolymer, ethylene propylene diene terpolymer, and combinations thereof.

The oxygen scavenger composition can include a trigger mechanism that is capable of initiating the oxygen scavenging. The trigger mechanism can be capable of initiating the oxygen scavenging upon, for example, exposure to UV radiation or moisture.

The oxygen scavenger composition can include a transition metal and/or transition metal salt. The transition metal can be chosen from manganese, iron, cobalt, nickel, copper, rhodium, ruthenium, and combinations thereof, and in particular can be chosen from cobalt benzoate, cobalt oleate, cobalt stearate, cobalt 2-ethylhexanoate, cobalt octanoate, cobalt neodecanoate, cobalt acetylacetonate, cobalt 2-ethylbutyrate, cobalt acetylacetonate, cobalt 2-ethylbutyrate, and combinations thereof.

The oxygen scavenger composition can include an antioxidant selected from the group consisting of 2,6-di(t-butyl)-4-methylphenol (BHT), 2,2'-methylene-bis(6-t-butyl-p-cresol), triphenylphosphite, tris-(nonylphenyl)phosphite, vitamin E, tetra-bismethylene 3-(3,5-ditertbutyl-4-hydroxyphenyl)-propionate methane, and dilaurylthiodipropionate, and combinations thereof.

An alternate embodiment is a polymeric-based overwrap having an oxygen scavenger layer situated between two barrier layers, wherein the two barrier layers are situated between two adhesive layers and the two adhesive layers are situated between two polymeric layers.

An alternate embodiment is a method of extending the life span of a polyolefin containing panel by incorporating an oxygen scavenger composition into a substrate layer of a polyolefin containing panel. The polyolefin containing panel can be selected from the group consisting of an organic photovoltaic cell (OPVC), a liquid crystal display (LCD) panel, a light-emitting diode (LED) panel, and combinations thereof. The polyolefin containing panel can also include a trigger mechanism that is capable of initiating oxygen scavenging upon a triggering event, for example, exposure to UV radiation or moisture.

DETAILED DESCRIPTION

Figure 1:
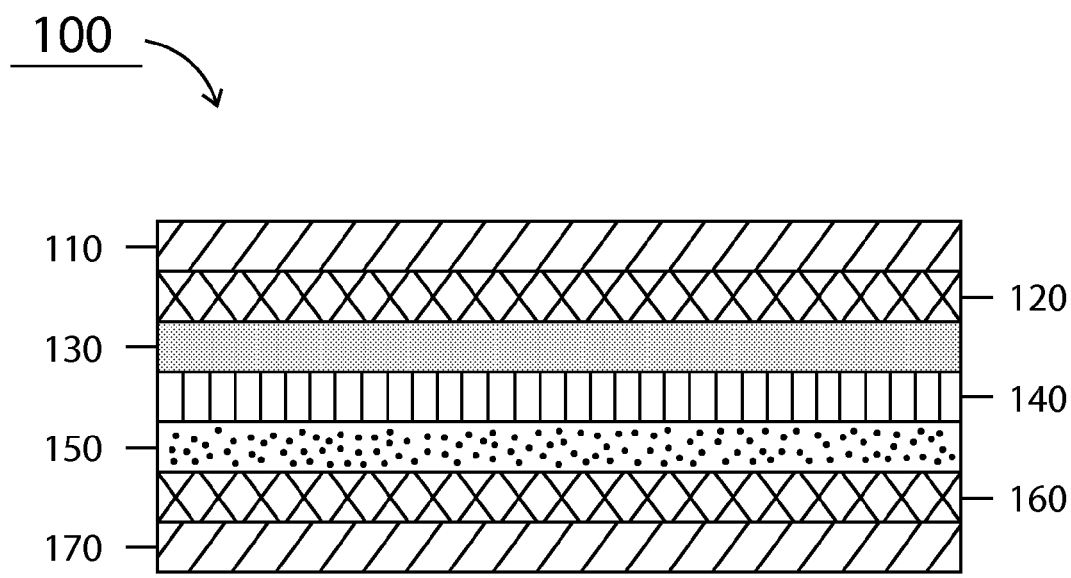
FIG. 1 illustrates a cross-sectional view of an organic photovoltaic cell.

Disclosed herein are ways of extending the life span of a polyolefin containing panel by incorporating an oxygen scavenger composition into a substrate layer of a polyolefin containing panel. The polyolefin containing panel can be selected from the group consisting of an organic photovoltaic cell (OPVC), a liquid crystal display (LCD) panel, a light-emitting diode (LED) panel, and combinations thereof. The polyolefin containing panel can also include a trigger mechanism that is capable of initiating oxygen scavenging upon a triggering event, for example, exposure to UV radiation or moisture. Also disclosed herein are methods of extending the life span of OPV solar panels through the use of oxygen scavenging technology.

Organic photovoltaic cells and other polyolefin containing panels can be sensitive to oxygen and water in the atmosphere and exposure to oxygen may reduce their shelf life and/or useful life. Oxygen absorbers can be used to reduce the oxygen content, however, these oxygen absorbers are typically iron based and require the presence of moisture to function properly. Similarly, ascorbic acid and enzymes have been used to reduce oxygen, however, these also generally require a high level of humidity to function properly.

Photovoltaic cells (PVC), or solar cells, include a semiconductor diode that converts visible light, infrared radiation (IR), and/or ultraviolet radiation (UV) into direct current (DC) electricity. Organic photovoltaic cells (OPVC) refer to photovoltaic cells that use conductive organic polymers or small organic molecules for light absorption and charge transport. In an embodiment, the OPVC include an anode, a cathode, and a photoactive region between the anode and the cathode. The photoactive region of the photosensitive device is the region that absorbs radiation in order to generate an electrical current.

In an embodiment, the photoactive region contains at least one organic layer. In another embodiment, the photoactive region contains a single organic layer. In further embodiment, the photoactive region contains two or more organic layers. The two or more layers may include at least one electron donor layer and at least one electron acceptor layer. These two layers have differences in electron affinity and ionization energy, such that electrostatic forces are generated at the interface between the two layers. The acceptor layer has a higher electron affinity than the donor layer. In an alternative embodiment, the photoactive region contains a polymer blend wherein the electron donor and acceptor are mixed together. In an embodiment, the OPVCs may also include at least one transparent electrode, in order to absorb incident radiation.

The organic photovoltaic cells may include a photoactive layer situated between two electrode layers. In an embodiment, the two electrode layers include a positive electrode layer and a negative electrode layer. In an embodiment, the photoactive layer includes an electron acceptor material and an electron donor material. In an embodiment, the photoactive layer contains an organic material. In an embodiment, the organic material includes electrically conductive polymers. In an embodiment, the electrically conductive polymers are selected from the group of polythiophenes, poly anilines, and polypyrroles, poly(p-phenylene vinylene) (PPV), poly[2-methoxy-5-(2'-ethyl-hexyloxy)-1,4-phenylene vinylene] (MEH-PPV), cyano-polyphenylene vinylene (CN-PPV), poly(3,4-ethylenedioxythiophene) (PEDOT), poly(3,4-ethylenedioxythiophene)poly(styrenesulfonate) (PEDOT:PSS), and combinations thereof. Examples of organic photovoltaic cells are disclosed in U.S. Pat. Nos. 4,164,431, 7,597,927, 7,772,484, 7,777,128, and 7,781,672 and U.S. Patent Publication Nos. US 2008/0083455 A1 and US 2008/0115833 A1, all of which are hereby incorporated by reference in their entirety.

In an embodiment, the organic photovoltaic cells may include substrates, electrically conductive layers, a hole blocking layer, a photoactive layer, and a hole carrier layer. FIG. 1 shows an embodiment of a polymer photovoltaic cell 100 that includes substrates 110 and 170, electrically conductive layers 120 and 160, a hole blocking layer 130, a photoactive layer 140, and a hole carrier layer 150. As used herein the term hole, or electron hole, refers to the conceptual and mathematical opposite of an electron and describes the lack of an electron at a position where one could exist in an atom or atomic lattice, such as the absence of an electron from an otherwise full electron shell. The substrate layers provide support for the cell, provide rigidity to the entire structure and can give a non-electrical/non-conductive framework for which to attach components or mounting/attachment brackets to enable the attachment to a separate structure, such as a roof of a building or a mounting pole.

The substrates 110 and/or 170 may include any material desirable to be included in an organic photovoltaic cell. The substrates may be rigid or flexible. In an embodiment, the substrates include materials selected from the group of polyethylene terephthalate (PET), polyethylene naphthalate (PEN), and a polyimide, and combinations thereof.

The electrically conductive layers 120 and 160 may include a first electrode layer 120 and a second electrode layer 160. In an embodiment the first electrode layer is a positive electrode layer and the second electrode layer is a negative electrode layer. In an embodiment, the first and second electrode layers are made of any desirable conductive material. In an embodiment, the conductive material is electrically conductive. The electrically conductive layers provide the means for an electrical current to be made within the cell. They also are the portion of the cell that provide the positive and negative connection to other cells or to a transmission means, such as wires that enable the transmission of the electrical energy that is produced by the cell.

The hole blocking layer 130 may include any material that is capable of transporting electrons to the electrically conductive layer 120 and of substantially blocking the transport of holes to electrically conductive layer 120. In an embodiment, the hole blocking layer 130 includes materials selected from the group of LiF and metal oxides (e.g., zinc oxide, titanium oxide) and combinations thereof. The thickness of layer 130 may be of any desired thickness. In some embodiments, the thickness of the layer 130 is at least 0.02 micron, at least 0.03 micron, at least 0.04 micron, or at least 0.05 micron thick. In other embodiments, the thickness of layer 130 is at most 0.5 micron, at most 0.4 micron, at most 0.3 micron, at most 0.2 micron, or at most 0.1 micron thick. In a further embodiment, this thickness is from 0.01 micron to 0.5 micron. The hole blocking layer 130 functions as a filter that can transport electrons while restricting the transport of holes.

The hole carrier layer 150 may include any material that is capable of transporting holes to the electrically conductive layer 160 and of substantially blocking the transport of electrons to the electrically conductive layer 160. In an embodiment, layer 150 includes materials selected from the group of polythiophenes (e.g., PEDOT), polyanilines, polyvinylcarbazoles, polyphenylenes, polyphenylvinylenes, polysilanes, polythienylenevinylenes, and polyisothianaphthanenes and combinations thereof. The thickness of layer 150 may be of any desired thickness. In some embodiments, the thickness of layer 150 is at least 0.01 micron, at least 0.05 micron, at least 0.1 micron, at least 0.2 micron, at least 0.3 micron, or at least 0.5 micron. In other embodiments, the thickness of layer 150 is at most five microns, at most three microns, at most two microns, or at most one micron. In a further embodiment, this thickness of layer 150 is from 0.01 micron to 0.5 micron. The hole carrier layer 150 functions as a filter that can transport holes while restricting the transport of electrons. The hole blocking layer 130 and hole carrier layer 150 together form a means to direct a flow of electrons in one direction and a flow of holes in the opposite direction, thereby enabling the possibility of an electrical current.

Photoactive layer 140 may include an electron acceptor material and an electron donor material. In an embodiment, the electron acceptor material is selected from the group of fullerenes, oxadiazoles, carbon nanorods, discotic liquid crystals, inorganic nanoparticles (such as nanoparticles formed of zinc oxide, tungsten oxide, indium phosphide, cadmium selenide and/or lead sulphide), inorganic nanorods (such as nanorods formed of zinc oxide, tungsten oxide, indium phosphide, cadmium selenide and/or lead sulphide), and polymers containing moieties capable of accepting electrons or forming stable anions (such as polymers containing CN groups, polymers containing $CF_3$ groups), and combinations thereof. In another embodiment, the electron acceptor material is a substituted fullerene (e.g., PCBM). In a further embodiment, the fullerene can be formed through derivatization where the fullerene is transformed into a similar chemical structure. For example, a fullerene derivative can include a fullerene (e.g., PCBG), a pendant group (e.g., a cyclic ether such as epoxy, oxetane, or furan) and a linking group that spaces the pendant group apart from the fullerene. Any combination of electron acceptor materials may be used.

In an embodiment, the electron donor material may be selected from the group of discotic liquid crystals, polythiophenes, polyphenylenes, polyphenylvinylenes, polysilanes, polythienylvinylenes, and polyisothianaphthalenes, and combinations thereof. In another embodiment, the electron donor material is poly(3-hexylthiophene). In a further embodiment, the photoactive layer 140 can include any combination of electron donor materials.

In an embodiment, the organic layers of the OPV cells may be fabricated using vacuum deposition, spin coating, organic vapor-phase deposition, inkjet printing and any other methods known to those skilled in the art.

These organic photovoltaic cells, such as the one depicted in FIG. 1, have been known to experience shelf-life problems. It has been found that oxygen diffuses through the substrate layers and oxidizes the polymer and/or electrode layers situated within the substrate layers, thereby causing a reduction in the shelf-life of the OPV cells. In an embodiment, oxygen-scavenging materials may be incorporated into, or onto, an organic photovoltaic cell in order to aid in the removal of the oxygen that may negatively effect the OPV cell shelf-life. Oxygen-scavenging materials are used in the food, beverage and pharmaceutical industries to protect and extend the shelf life of some products. The oxygen scavenger can remove oxygen in the headspace of packages and also prevent ingress of oxygen by reacting with oxygen that permeates through the package (e.g., film, bottle or sealant).

Polymeric oxygen scavengers, or oxygen-scavenging polymers (OSP), may contain a polymeric backbone with at least one oxidizable component. Examples of such polymeric oxygen scavengers include terpenes, polyisoprene, polybutadiene, and ethylene propylene diene monomer (EPDM), and copolymers thereof, such as styrene-butadiene. In an embodiment, the oxygen-scavenging polymer (OSP) may be any organic compound that irreversibly reacts with oxygen.

In another embodiment, the OSP is an addition polymer or a condensation polymer. An addition polymer is a polymer that is formed by an addition reaction, where many monomers bond together via rearrangement of bonds without the loss of any atom or molecule. In an embodiment, the addition polymers may include a polymer or copolymer containing either a main chain or pendant cyclic olefinic group. In an embodiment, the OSP is selected from the group of ethylene methyl acrylate cyclohexenylmethyl acrylate terpolymer (EMCM), ethylene vinyl cyclohexene copolymer (EVCH), ethylene cyclohexenylmethyl acrylate copolymer (ECHA), and cyclohexenylmethyl acrylate homopolymer (CHAA), and combinations thereof. In another embodiment, the addition polymers may include a polymer or copolymer containing a pendant benzylic group, such as ethylene methyl acrylate benzylmethyl acrylate terpolymer (EMBZ). In a further embodiment, the OSP includes polymeric compounds such as polypentenamer, polyoctenamer, and other polymers prepared by olefin metathesis; diene oligomers such as squalene; and polymers or copolymers derived from dicyclopentadiene, norbornadiene, 5-ethylidene-2-norbornene, or other monomers containing more than one conjuaged or non-conjugated carbon-carbon double bond. In a further embodiment, the OSP includes copolymers of ethylene and cyclohexenylmethacrlyate, ethylene and vinylcyclohexene. The OSP can also include aromatic containing polymers such as ethylene vinyl toluene. In an embodiment, the OSP may include oxygen scavenging resins, such as Aegis® HFX nylon barrier, commercially available from Honeywell International, Inc.

In an embodiment, the OSP is a condensation polymer. A condensation polymer is formed by a condensation reaction where a molecule, usually water, is lost during the formation. In an embodiment, the condensation polymers may include polyester polymers or copolymers containing carbon-carbon double bonds. In an embodiment, any two or more oxygen scavenging polymers may be incorporated with the OPVC.

In an embodiment, the present invention includes an OPV cell containing an oxygen scavenger. In an embodiment, the oxygen scavenger is incorporated between substrate layers of the OPV cell. In another embodiment, the oxygen scavenger is incorporated into a PET overwrap of an OPV cell.

Figure 2:
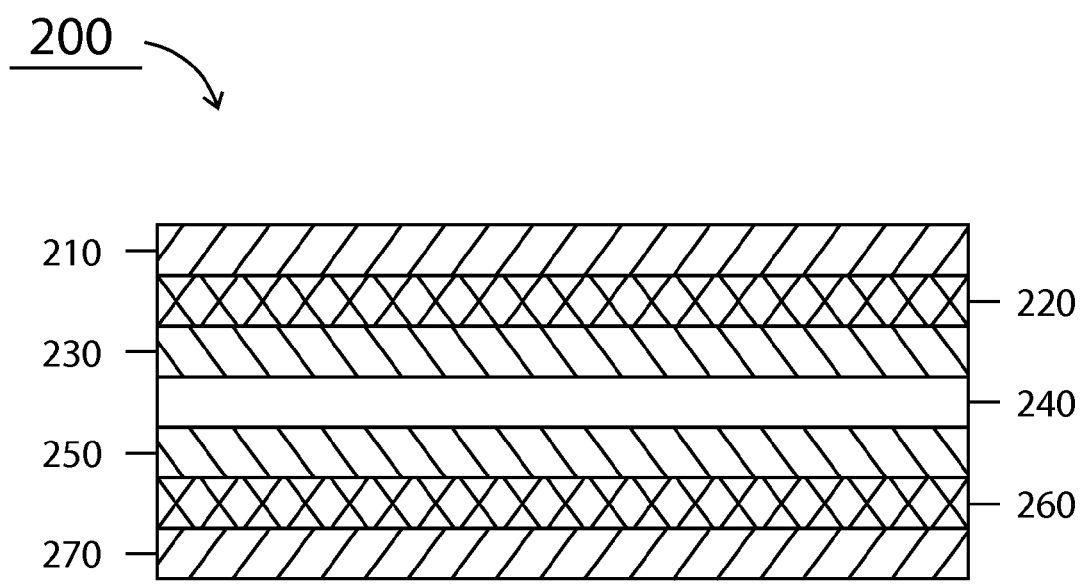
FIG. 2 illustrates a cross-sectional view of a protected polymer photovoltaic cell.

FIG. 2 shows an embodiment of a protected polymer photovoltaic cell 200 that includes PET-SiOx protective layers 210 and 270, oxygen scavenging layers 220 and 260, PET layers 230 and 250, and the OPV cell layer 240. In an embodiment, the PET overwrap is replaced with a polyolefin-based overwrap. In an embodiment, the PET layers 230 and 250 can be replaced with polyolefin-based layers. In an embodiment, the PET-SiOx protective layers 210 and 270 can be replaced with polyolefin-based layers.

Figure 3:
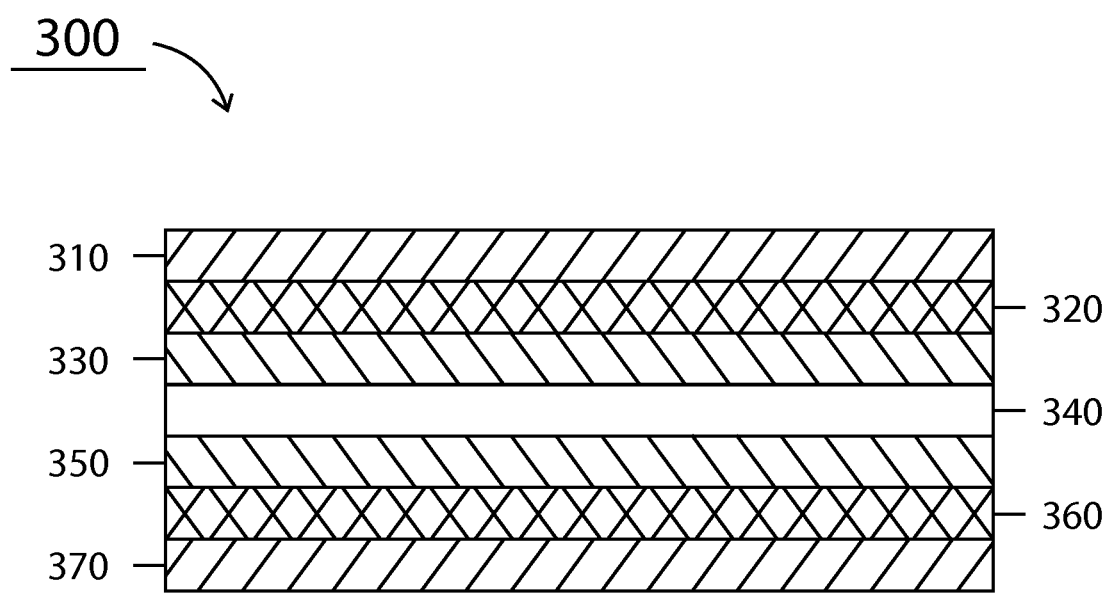
FIG. 3 illustrates a cross-sectional view of a polyolefin-based overwrap.

FIG. 3 shows a polyolefin-based overwrap 300 having polymer layers 310 and 370, adhesive layers 320 and 360, oxygen barrier layers 330 and 350, and an oxygen scavenger layer 340.

The polymer layers 310 and 370 of the polyolefin-based overwrap 300 may contain any desirable polyolefin-based components and may be the substrate. In an embodiment, the polymer layers 310 and 370 are selected from the group of polyethylene, polyethylene terephthalate (PET), polyethylene naphthalate (PEN), and polypropylene, and combinations thereof. The adhesive layers 320 and 360 of the polyolefin-based overwrap 300 may contain any composition capable of ensuring proper adhesion between the barrier layers 330 and 350 and the polyolefin outer layers 310 and 270. In an embodiment, the adhesive layers 320 and 360 are formed from ethylene-vinyl acetate (EVA).

The barrier layers 330 and 350 of the polyolefin-based overwrap 300 may contain any oxygen scavenger composition. In an embodiment, the oxygen scavenger composition includes a blend of an oxygen barrier polymer and an oxygen scavenger polymer. An oxygen barrier polymer can refer to any polymer capable of providing a barrier to oxygen passage. In an embodiment, the oxygen barrier polymer is polyacrylonitrile (PAN) or a copolymer of acrylonitrile. In another embodiment, the oxygen barrier polymer is poly(vinylidene dichloride) (PVDC). In further embodiment, the oxygen barrier polymer is polyethylene terephthalate (PET). In an even further embodiment, the oxygen barrier polymer is polyethylene naphthalate (PEN). In another embodiment, the oxygen barrier polymer is ethylene vinyl alcohol (EVOH). In another embodiment, the oxygen barrier polymer is a nylon composition. In an embodiment, the barrier layer is selected from the group of PAN, PVDC, PET, EVOH, nylon, PEN, and combinations thereof. In an alternative embodiment, the oxygen barrier polymer is a polyamide other than nylon-MXD6. In an embodiment, the polyamide is either aliphatic or aromatic. In another embodiment, the polyamides selected from the group of nylon 6 and nylon 6,6 and combinations thereof.

In an embodiment, additional compounds may be used with the oxygen scavenger in order to enhance the functionality of the oxygen scavenging polymers. In an embodiment, a metallic accelerator can be added to the oxygen scavenger composition, which can decompose peroxide radicals that may be formed during oxygen scavenging. In an embodiment, the metallic accelerator may include metallic salts, such as cobalt octanoate. In an embodiment, the oxygen scavenger composition can contain an oxidation catalyst. In an embodiment, the oxidation catalyst includes a transition metal, which can increase the rate of oxygen scavenging. In an embodiment, the transition metal is in the form of a salt and the transition metal is selected from the first, second or third transition series of the Periodic Table. In an embodiment, the transition metal is selected from the group of manganese, iron, cobalt, nickel, copper, rhodium, and ruthenium, and combinations thereof. In another embodiment, the transition metal is a transition metal salt selected from the group of cobalt benzoate, cobalt oleate, cobalt stearate, cobalt 2-ethylhexanoate, cobalt octanoate, cobalt neodecanoate, cobalt acetylacetonate, cobalt 2-ethylbutyrate, and combinations thereof. In a further embodiment, a counterion is employed with the transition metal or transition metal salt. In an embodiment, the counterion is selected from the group of chloride acetate, chloride oleate, chloride stearate, chloride palmitate, chloride 2-ethylhexanoate, chloride neodecanoate, chloride naphthenate, and combinations thereof.

The transition metal and/or the transition metal salt may be present in the oxygen scavenger composition in any desired amounts. In an embodiment, the transition metal may be present in amounts ranging from 10 to 10,000 ppm. In another embodiment, the transition metal and/or the transition metal salt may be present in the oxygen scavenger layer, in the oxygen barrier layer, or in a layer adjacent to the oxygen barrier layer, or any combination thereof.

An embodiment of the present invention includes an oxygen scavenger composition includes a block co-polymer having at least one block including a polyester condensation polymer segment having cycloalkenyl group(s) or functionality directly or indirectly bonded to the polymer chain of said block, and having at least one second block including a polymer segment of a thermoplastic, film forming material as described in U.S. Pat. No. 7,754,798 to Ebner et al., that is incorporated herein by reference in its entirety. The block copolymer has been found to act as an oxygen scavenger agent under both ambient and refrigerated conditions, to be compatible with conventional film forming packaging materials, and to provide compositions exhibiting low tack that can be readily formed and processed using conventional film forming equipment.

In an embodiment, the oxygen scavenger composition can contain a trigger mechanism that activates the oxygen scavenging characteristic. With the use of a trigger mechanism the organic photovoltaic solar panel can have increased shelf life or increased storage ability when not exposed to the trigger mechanism. In an embodiment the trigger mechanism activates the oxygen scavenging characteristic upon the exposure to UV light. In an alternate embodiment the trigger mechanism activates the oxygen scavenging characteristic upon the exposure to moisture. Any suitable triggering mechanism can be used with the present invention, such as those disclosed in U.S. Pat. No. 7,494,605 to Dayrit et al. and U.S. Pat. No. 7,504,045 to Speer et al., both incorporated herein in their entirety.

In an embodiment, the oxygen scavenger composition can contain a photoinitiator. In an embodiment, the photoinitiator is selected from the group of benzophenone, o-methoxybenzophenone, acetophenone, o-methoxy-acetophenone, acenaphthenequinone, methyl ethyl ketone, valerophenone, hexanophenone, α-phenyl-butyrophenone, p-morpholinopropiophenone, dibenzosuberone, 4-morpholinobenzophenone, benzion, benzion methyl ether, 4-o-morpholinodeoxybenzion, p-diacetylbenzene, 4-aminobenzophenone, 4'-methoxyacetophenone, α-tetralone, 9-acetylphenanthrene, 2-acetylphenanthrene, 10-thioxanthenone, 3-acetylphenanthrene, 3-acetylindole, 9-flourenone, 1-indanone, 1,3,5-triacetylbenzene, thioxanthen-9-one, xanthene-9-one, 7-H-benz[de]anthracen-7-one, benzoin tetrahydropyranyl ether, 4,4'-bis(dimethylamino)-benzophenone, 1'-acetonaphthone, 2'-acetonaphthone, acetonaphthone, 2,3-butanedione, benz[a]anthracene-7,12-dione, 2,2-dimethoxy-2-phenylacetophenone, α,α-diethoxyacetophenone, and α,α-dibutoxyacetophenone, and combinations thereof. In another embodiment, the photoinitiator is selected from the group of Rose Bengal, methylene blue, and tetraphenyl, and combinations thereof. In a further embodiment, the oxygen scavenger composition can contain polymeric initiators. In an even further embodiment, the polymeric initiators are selected from the group of poly(ethylene carbon monoxide) and oligo[2-hydroxy-2-methyl-1-[4-(1-methylvinyl)phenyl] propanone], and combinations thereof.

In an embodiment, antioxidants can be used in the oxygen scavenger composition to control scavenging initiation. An antioxidant is defined herein as a material that inhibits oxidative degradation or crosslinking of polymers. These additives may prolong the induction period for oxygen scavenging in the absence of irradiation. When it is desired to commence oxygen scavenging by the oxygen scavenger, the cell can be exposed to radiation.

In an embodiment, the oxygen scavenger composition can contain an antioxidant. Commercially available antioxidants that can be used include without limitation those from Ciba Specialty Chemical such as Irganox 1010, Irganox 1076, Irganox 1330, Irgafos 168; those from Albemarle Corporation such as Ethanox 330; and those from Dover Chemical Corporation such as Doverphos S9228. In an embodiment, the antioxidant is selected from the group of 2,6-di(t-butyl)-4-methylphenol (BHT), 2,2'-methylene-bis(6-t-butyl-p-cresol), triphenylphosphite, tris-(nonylphenyl)phosphite, vitamin E, tetra-bismethylene 3-(3,5-ditertbutyl-4-hydroxyphenyl)-propionate methane, dilaurylthiodipropionate, and combinations thereof. In an embodiment, the antioxidant may be present in amounts ranging from 0.01 to 5 wt % of the oxygen scavenger composition, optionally from 0.01 to 1 wt %, optionally from 0.1 to 0.5 wt %.

In an embodiment, the oxygen scavenger may include other additives to impart desired properties, including, but not limited to, fillers, pigments, dyestuffs, stabilizers, processing aids, plasticizers, fire retardants, and anti-fog agents. In an embodiment, any other additives added to the oxygen scavenger composition will not be present in more than 10 wt % of the oxygen scavenger composition. In another embodiment, any other additives added to the oxygen scavenger composition will not be present in more than 5 wt % of the oxygen scavenger composition.

An embodiment of the present invention includes utilizing the concept of embedding an oxygen scavenger into articles such as liquid crystal display (LCD) panels and light-emitting diode (LED) panels. The embodiments can include a trigger mechanism that initiates the oxygen scavenging characteristics upon a triggering event occurance, such as exposure to UV radiation or moisture, wherein the oxygen scavenging capability is then realized. For example, a UV photoinitiator when exposed to UV light, triggers the formation of free radicals that can consume the antioxidants present and start to consume oxygen. This can extend the shelf life of the article by the oxygen scavenging characteristic not being activated while in storage or during transport.

As used herein the term "hole" or "electron hole", refers to the conceptual and mathematical opposite of an electron and describes the lack of an electron at a position where one could exist in an atom or atomic lattice, such as the absence of an electron from an otherwise full electron shell.

As used herein, the term "organic material" refers to all types of organic, metalorganic and/or organic/inorganic synthetics including plastics.

As used herein, the term "organic photovoltaic cell" refers to a photovoltaic cell that uses organic electronics.

Use of the term "optionally" with respect to any element of a claim is intended to mean that the subject element is required, or alternatively, is not required. Both alternatives are intended to be within the scope of the claim. Use of broader terms such as comprises, includes, having, etc. should be understood to provide support for narrower terms such as consisting of, consisting essentially of, comprised substantially of, etc.

It is to be understood that while illustrative embodiments have been depicted and described, modifications thereof can be made by one skilled in the art without departing from the spirit and scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.).

Depending on the context, all references herein to the "invention" may in some cases refer to certain specific embodiments only. In other cases it may refer to subject matter recited in one or more, but not necessarily all, of the claims. While the foregoing is directed to embodiments, versions and examples of the present invention, which are included to enable a person of ordinary skill in the art to make and use the inventions when the information in this patent is combined with available information and technology, the inventions are not limited to only these particular embodiments, versions and examples. Also, it is within the scope of this disclosure that the aspects and embodiments disclosed herein are usable and combinable with every other embodiment and/or aspect disclosed herein, and consequently, this disclosure is enabling for any and all combinations of the embodiments and/or aspects disclosed herein. Other and further embodiments, versions and examples of the invention may be devised without departing from the basic scope thereof and the scope thereof is determined by the claims that follow.

What is claimed is:

1. A photovoltaic cell, comprising:
   at least one substrate comprising a polyolefins-based overwrap, wherein the polyolefins-based overwrap comprises two oxygen barrier layers and an oxygen scavenger layer, wherein the oxygen scavenger layer is situated between the two oxygen barrier layers, and wherein the two oxygen barrier layers are situated between two polyolefin layers;
   two electrode layers; and
   an organic photovoltaic layer situated between the two electrode layers,
   wherein the oxygen scavenger layer comprises a trigger mechanism that is capable of initiating the oxygen scavenging when triggered by exposure to UV light, and
   wherein the trigger mechanism comprises a UV photoinitiator that, when exposed to UV light, triggers formation of free radicals capable of consuming oxygen.

2. The photovoltaic cell of claim 1, where the oxygen scavenger layer comprises a blend of an oxygen barrier polymer and an oxygen scavenger polymer.

3. The photovoltaic cell of claim 1, wherein the at least one substrate comprises polyethylene, polyethylene terephthalate, polyethylene naphthalate, a polyimide, and combinations thereof.

4. The photovoltaic cell of claim 1, wherein the organic photovoltaic layer contains an electron acceptor material and an electron donor material.

5. The photovoltaic cell of claim 4, wherein the electron acceptor material is selected from the group consisting of fullerenes, oxadiazoles, carbon nanorods, discotic liquid crystals, inorganic nanoparticles, inorganic nanorods, and polymers containing moieties capable of accepting electrons or forming stable anions, and combinations thereof.

6. The photovoltaic cell of claim 4, wherein the electron donor material is selected from the group consisting of discotic liquid crystals, polythiophenes, polyphenylenes, polyphenylvinylenes, polysilanes, polythienylvinylenes, and polyisothianaphthalenes, and combinations thereof.

7. The photovoltaic cell of claim 1, wherein the two oxygen barrier layers are situated between two adhesive layers and wherein the two adhesive layers are situated between the two polyolefin layers.

8. The photovoltaic cell of claim 1, wherein the oxygen scavenger layer is selected from the group consisting of ethylenically unsaturated polymers, ethylene methylacrylate cyclohexenylmethyl acrylate terpolymer, ethylene vinyl cyclohexene copolymer, ethylene cyclohexenylmethyl acrylate copolymer, cyclohexenylmethyl acrylate homopolymer, ethylene vinyl toluene copolymer, ethylene propylene diene terpolymer, and combinations thereof.

9. The photovoltaic cell of claim 1, wherein the oxygen barrier layers are selected from the group consisting of PAN, PVDC, PET, EVOH, nylon, PEN, and combinations thereof.

10. The photovoltaic cell of claim 1, wherein the oxygen scavenger layer further comprises an oxidation catalyst comprising a transition metal and/or transition metal salt.

11. The photovoltaic cell of claim 1, wherein the oxygen scavenger layer further comprises an antioxidant.

12. The photovoltaic cell of claim 1, wherein the organic photovoltaic layer converts ultraviolet radiation into direct current electricity.

13. The photovoltaic cell of claim 1, wherein the photoinitiator is selected from the group consisting of: benzophenone, o-methoxybenzophenone, acetophenone, o-methoxy-acetophenone, acenaphthenequinone, methyl ethyl ketone, valerophenone, hexanophenone, a-phenyl-butyrophenone, p-morpholinopropiophenone, dibenzosuberone, 4-morpholinobenzophenone, benzion, benzion methyl ether, 4-o-morpholinodeoxybenzion, p-diacetylbenzene, 4-aminobenzophenone, 4'-methoxyacetophenone, a-tetralone, 9-acetylphenanthrene, 2-acetylphenanthrene, 10-thioxanthenone, 3-acetylphenanthrene, 3-acetylindole, 9-flourenone, 1-indanone, 1,3,5-triacetylbenzene, thioxanthen-9-one, xanthene-9-one, 7-H-benz[de]anthracen-7-one, benzoin tetrahydropyranyl ether, 4,4'-bis(dimethylamino)-benzophenone, 1'-acetonaphthone, 2'-acetonaphthone, acetonaphthone, 2,3-butanedione, benz[a]anthracene-7,12-dione, 2,2-dimethoxy-2-phenylacetophenone, α,α-diethoxyacetophenone, α,α-dibutoxyacetophenone, and combinations thereof.

14. The photovoltaic cell of claim 1, wherein the photoinitiator is selected from the group consisting of: Rose Bengal, methylene blue, tetraphenyl, and combinations thereof.

15. The photovoltaic cell of claim 1, wherein the oxygen scavenger layer comprises a polymeric initiator selected from the group consisting of: poly(ethylene carbon monoxide), oligo[2-hydroxy-2-methyl-1-[4-(1-methylvinyl)phenyl]propanone], and combinations thereof.

16. The photovoltaic cell of claim 4, wherein the electron acceptor material is selected from the group consisting of oxadiazoles, carbon nanorods, discotic liquid crystals, inorganic nanoparticles, inorganic nanorods, and polymers containing moieties capable of accepting electrons or forming stable anions, and combinations thereof.

17. The photovoltaic cell of claim 4, wherein the electron donor material is selected from the group consisting of discotic liquid crystals, polyphenylenes, polyphenylvinylenes, polysilanes, polythienylvinylenes, and polyisothianaphthalenes, and combinations thereof.

18. A photovoltaic cell, comprising:
at least one substrate comprising a polyolefins-based overwrap, wherein the polyolefins-based overwrap comprises two oxygen barrier layers and an oxygen scavenger layer, wherein the oxygen scavenger layer is situated between the two oxygen barrier layers, and wherein the two oxygen barrier layers are situated between two polyolefin layers;
two electrode layers; and
an organic photovoltaic layer situated between the two electrode layers;
wherein the organic photovoltaic layer converts ultraviolet radiation into direct current electricity,
wherein the oxygen scavenger layer comprises a trigger mechanism that is capable of initiating the oxygen scavenging when triggered by exposure to UV light, and
wherein the trigger mechanism comprises a UV photoinitiator that, when exposed to UV light, triggers formation of free radicals capable of consuming oxygen.

* * * * *